United States Patent
Kim

(10) Patent No.: US 7,177,204 B2
(45) Date of Patent: Feb. 13, 2007

(54) PULSE WIDTH ADJUSTING CIRCUIT FOR USE IN SEMICONDUCTOR MEMORY DEVICE AND METHOD THEREFOR

(75) Inventor: Ji-Hyun Kim, Ichon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 39 days.

(21) Appl. No.: 10/874,362

(22) Filed: Jun. 24, 2004

(65) Prior Publication Data

US 2005/0105345 A1  May 19, 2005

(30) Foreign Application Priority Data

Oct. 29, 2003  (KR) ............... 10-2003-0075986

(51) Int. Cl.
*G11C 7/00* (2006.01)
(52) U.S. Cl. ........................ 365/191; 365/194
(58) Field of Classification Search ................ 365/201, 365/194, 233, 191; 327/172–174
See application file for complete search history.

(56) References Cited

U.S. PATENT DOCUMENTS

| | | | |
|---|---|---|---|
| 6,473,468 B1 * | 10/2002 | Do | 375/285 |
| 6,587,978 B1 | 7/2003 | Merritt et al. | |
| 6,906,970 B2 * | 6/2005 | Kim et al. | 365/201 |

FOREIGN PATENT DOCUMENTS

| | | | |
|---|---|---|---|
| KR | 2002043782 | * | 6/2002 |
| KR | 1020020043782 | | 6/2002 |
| KR | 2002053537 | * | 7/2002 |
| KR | 2002053537 A | * | 7/2002 |
| KR | 2003049187 | * | 6/2003 |

* cited by examiner

*Primary Examiner*—Amir Zarabian
*Assistant Examiner*—Anthan Tran
(74) *Attorney, Agent, or Firm*—Mayer Brown Rowe & Maw LLP

(57) ABSTRACT

It is capable of adjusting the pulse width regardless of an amount of delay in a delaying part by controlling pulse width of an output signal based on an externally provided control signal. A pulse width adjusting circuit for use in a semiconductor memory device comprises a unit operable at least partially by a pulse width control signal that is provided externally. The unit has an ability of adjusting pulse width of an output signal by using the pulse width control signal in test mode of the semiconductor memory device.

8 Claims, 4 Drawing Sheets

PULSE WIDTH ADJUSTING CIRCUIT FOR USE IN SEMICONDUCTOR MEMORY DEVICE AND METHOD THEREFOR

FIELD OF THE INVENTION

The present invention relates to a semiconductor memory device; and, more particularly, to a technique for adjusting pulse width of a pulse signal as much as desired when the pulse width of the input pulse signal is to be extended.

BACKGROUND OF THE INVENTION

In conventional techniques, it is not capable of adjusting pulse width of a pulse signal, which is requested in test mode of a semiconductor memory device, as much as desired. Therefore, when the pulse width is to be changed, the pulse width should be confirmed as a metal option in a delay circuit is changed step by step.

FIG. 1 provides a conventional pulse signal generating circuit for test mode and FIG. 2 shows a waveform diagram on each node in FIG. 1 step by step.

(Step I)

When power is inputted to a semiconductor memory device, a power turn-on signal pwrup is shifted from "L" state to "H" state and maintained in that state and a pulse input signal in is maintained in the "L" state. At that point, it can be seen that the logic values of a node A, a node C, a node D, a node 1 node_1 and a node 2 node_2 are maintained in the "H" state, and the logic values of a node B and an output signal out are maintained in the "L" state.

(Step II)

When the input signal in having a pulse form is shifted from the "L" state to the "H" state, the logic values of the node A and the node B go to the "L" state and the "H" state, respectively, and the output signal out goes to the "H" state.

(Step III)

The input signal in is shifted from the "H" state to the "L" state.

(Step IV)

The logic value of the node B, being in the "H" state, is transferred to the node 1 as the "L" state, after going through a second inverter 106. When the logic value of the node 1, being in the "L" state, is outputted after being delayed at a delay 107, the node 2 is shifted from the "H" state to the "L" state. At this point, when the logic value of the node D goes to the "H" state, the logic values of the node B and the output signal out are shifted to the "L" state.

As a result, it can be seen that the pulse width of the output signal out is extended by A compared to the pulse width of the input signal in. However, in such a circuit constitution, whenever the pulse width of the output signal out is to be changed, the metal option in the delay 107 should be changed step by step through FIB (Focused Ion Beam) and it costs time and expense. Further, the amount of the pulse width that can be changed should be restricted to the delay amount of that implemented delay in the circuit.

SUMMARY OF THE INVENTION

It is, therefore, a primary object of the present invention to provide a pulse width adjusting circuit capable of adjusting pulse width of an output signal as much as wanted regardless of an amount of delay of a delay by controlling the pulse width of the output signal based on an externally provided control signal.

In accordance with the present invention, there is provided a pulse width adjusting circuit for use in a semiconductor memory device, which comprises a unit that is operable at least partially by a pulse width control signal that is provided externally wherein the unit has an ability of adjusting pulse width of an output signal by using the pulse width control signal in test mode of the semiconductor memory device.

Preferably, the pulse width adjusting circuit further comprises an ability of extending pulse width of an input signal by a predetermined time to output as the output signal in normal mode of the semiconductor memory device.

Preferably, the pulse width adjusting circuit uses a mode discrimination signal that is provided externally to discriminate between the test mode and the normal mode.

Preferably, the pulse width adjusting circuit comprises a first transfer gate using the mode discrimination signal as a gate control signal and receiving a first signal that is based on the pulse width control signal as an input, and a second transfer gate using the mode discrimination signal as a gate control signal and receiving a second signal that is generated by extending the pulse width of the output signal by a predetermined time as an input.

Preferably, extending the pulse width of the second signal is performed in a delaying means that is included in the pulse width adjusting circuit.

Further, in accordance with the present invention, there is provided a pulse width adjusting method for use in a semiconductor memory device, which comprises the steps of: (a) receiving a first signal that is based on an external pulse width control signal, and a second signal that is generated by extending pulse width of an output signal of a pulse width adjusting circuit by a predetermined time, and (b) selecting one between the first signal and the second signal.

Preferably, the step of selecting one between the first signal and the second signal is performed by a mode discrimination signal that is provided externally.

Preferably, the mode discrimination signal is used as a control signal of a plurality of transfer gates that receive the first signal and the second signal as inputs, respectively.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, with reference to the accompanying drawings, a preferred embodiment of the present invention will be explained in detail.

Figure 1:
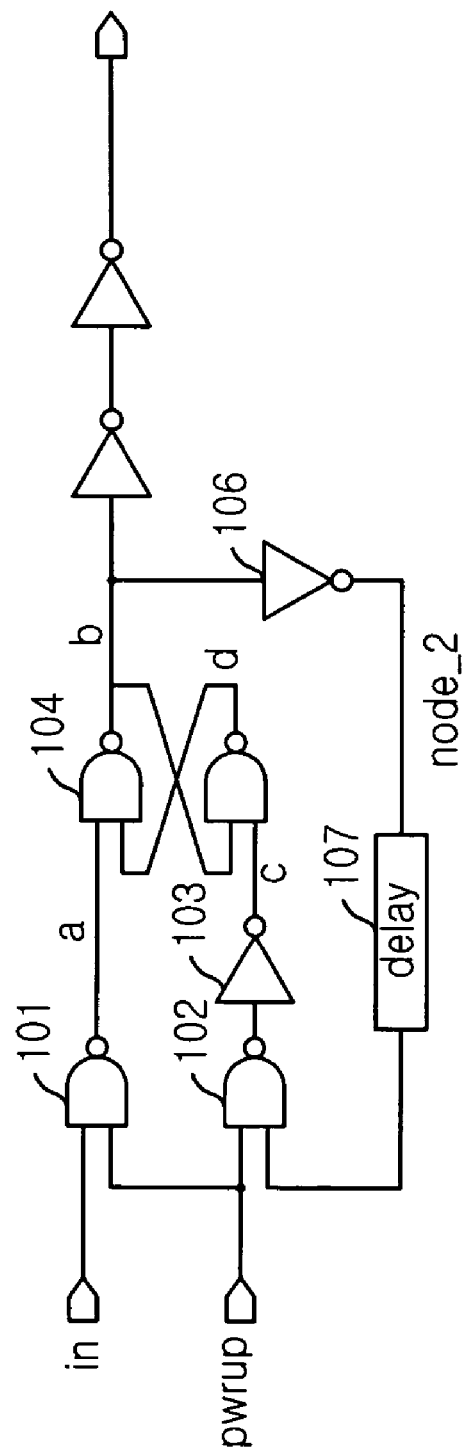
FIG. 1 provides a conventional pulse signal generating circuit for test mode.
Figure 2:
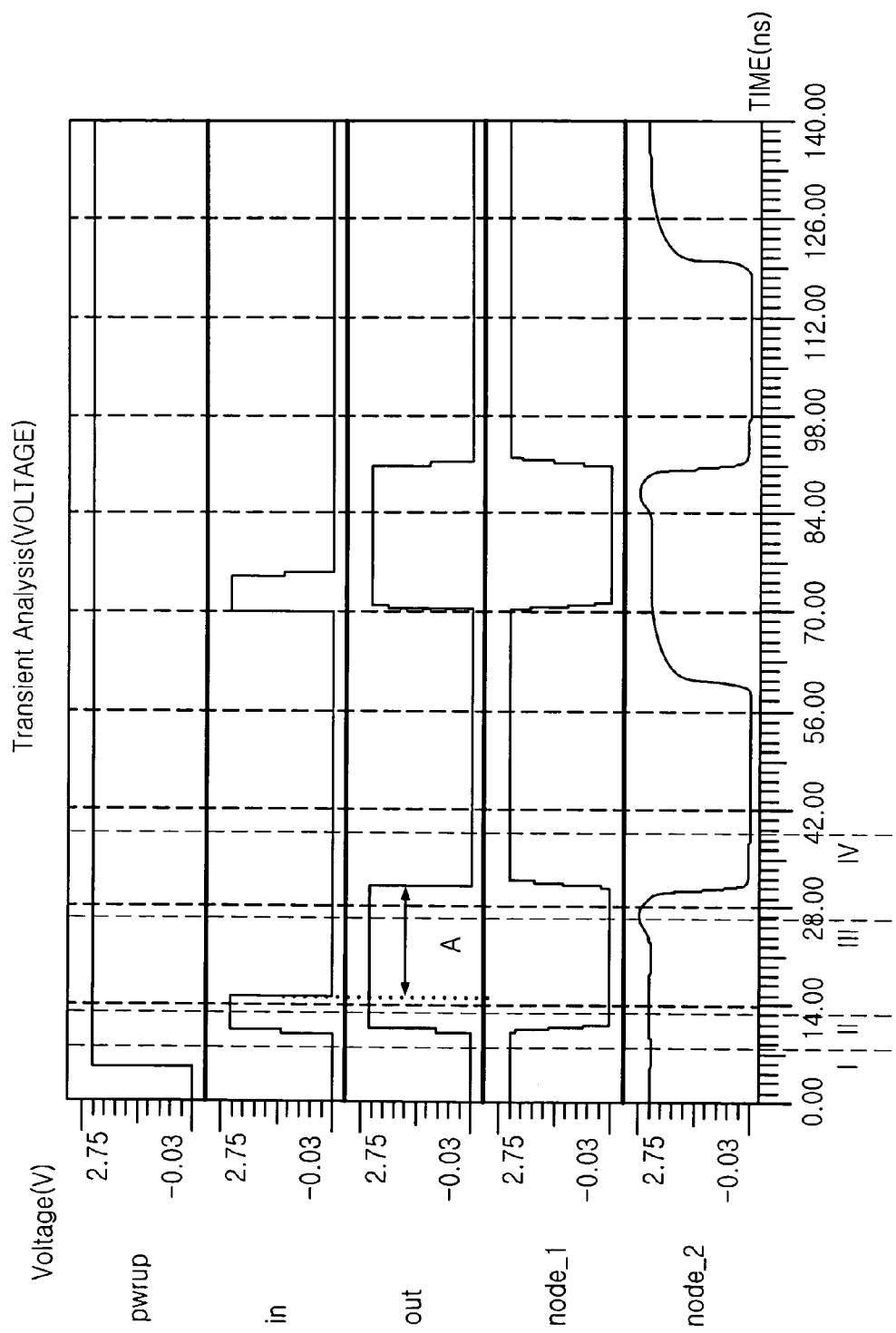
FIG. 2 shows a waveform diagram on each node in FIG. 1 step by step.
Figure 3:
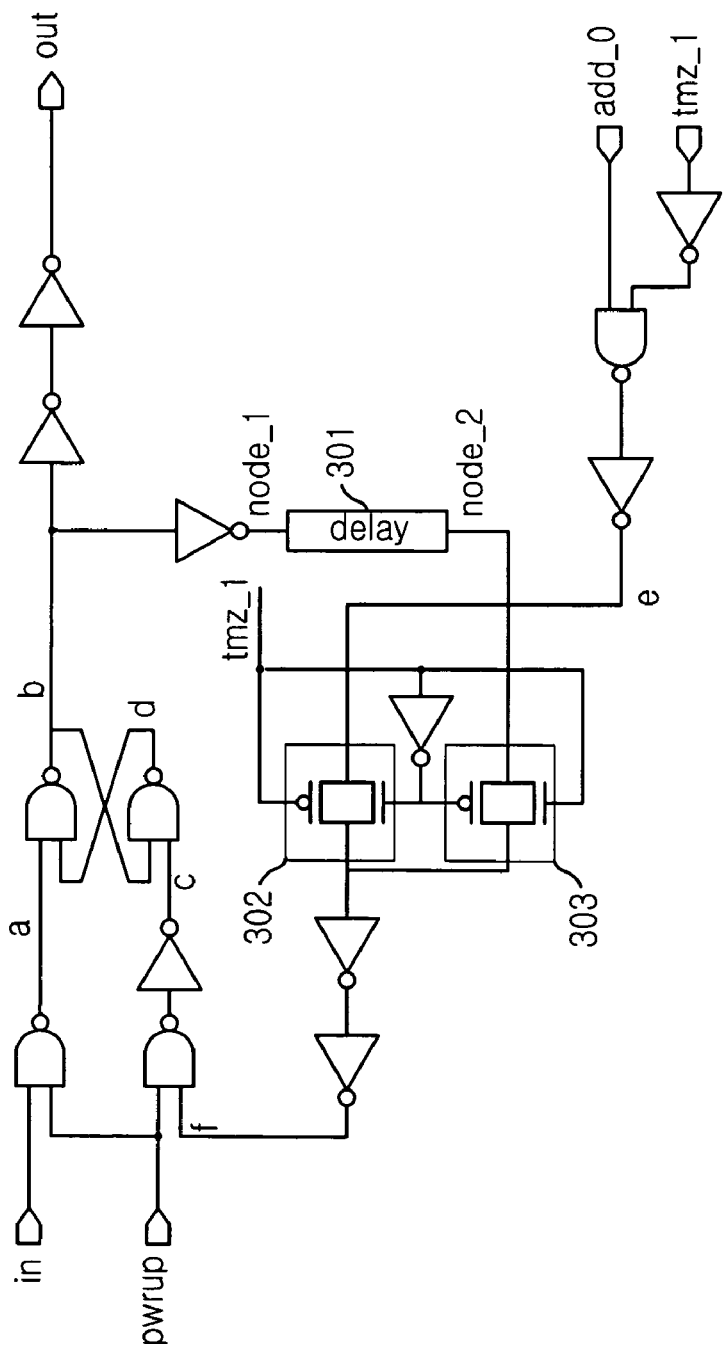
FIG. 3 represents a pulse signal generating circuit for test mode in accordance with the present invention.
Figure 4:
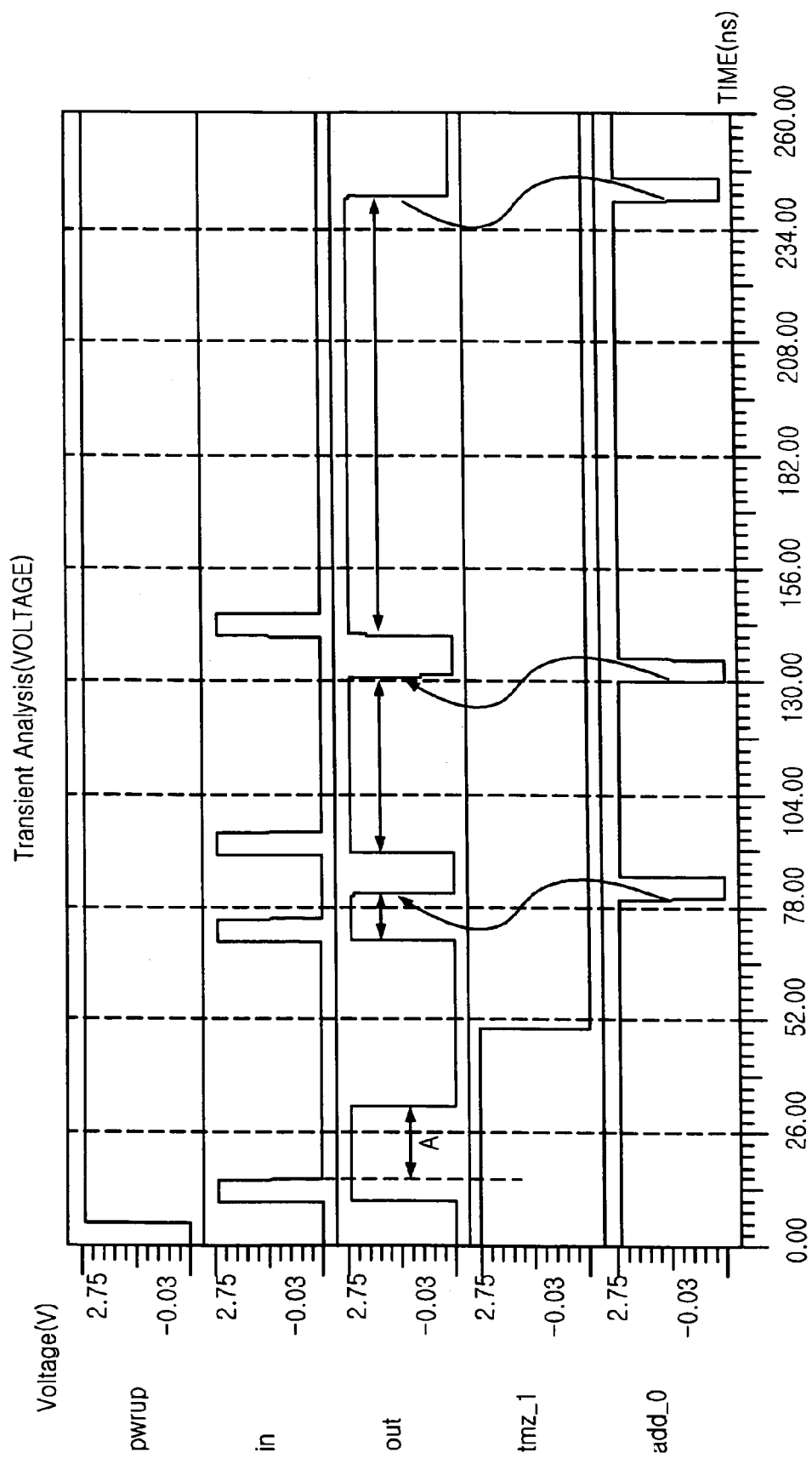
FIG. 4 illustrates a waveform diagram on each node in FIG. 3 step by step.

FIG. 3 represents a pulse signal generating circuit for test mode in accordance with the present invention and FIG. 4 illustrates a waveform diagram on each node in FIG. 3 step by step.

A mode discrimination signal tmz_1 maintains its state on "L" state in test mode and on "H" state in normal mode. When a semiconductor memory device is operated in the normal mode, the mode discrimination signal tmz_1 is on the "H" state so that a logic value of a node 2 is transferred to a node F through a second transfer gate 303. On the other hand, if the mode discrimination signal tmz_1 is on the "H" state, a logic value of a node E depends on a pulse width control signal ADD_0 that is provided externally.

(1) When the semiconductor memory device is operated in the normal mode (i.e., when the mode discrimination signal tmz_1 is on the "H" state):

A timing at which an output signal out is once shifted to the "H" state and then shifted again to the "L" state when a pulse signal of the "H" state is inputted is a timing at which the logic value of the node F is shifted from the "H" state to the "L" state. That is, according to the shift of the input signal in to the "H" state, a logic value of a node 1 is shifted to the "L" state. Then, the logic value of the node F that has been kept on the "H" is shifted to the "L" state when the logic value of the node 1 on the "L" state is delayed at a delay 301 by a predetermined time delay. As a result, a logic value of a logic B is shifted to the "L" state, which leads the output signal out to the "L" state.

(2) When the semiconductor memory device is operated in the test mode (i.e., when the mode discrimination signal tmz_1 is on the "L" state):

When the input signal in is shifted to the "L" state while the pulse width control signal ADD_0 maintains its state on the "H" state, the output signal out is shifted from the "L" state to the "H" state. The logic value of the node B that has the inverted value of the output signal out is delayed at the delay 301 by the predetermined time delay and then outputted as the logic value of the "L" state to the node 2. However, because the mode discrimination signal tmz_1 is on the "L" state, the second transfer gate 303 is turned off so that the logic value of the node 2 cannot be transferred to the node F. Consequently, when the mode discrimination signal tmz_1 is on "L" state, the output signal out is determined depending on the input signal to a first transfer gate 302. That is, the logic value of the node F maintains its state on the "H" state while the pulse width control signal ADD_0 is on the "H" state, and the output signal out is shifted from the "H" state to the "L" state when the pulse width control signal ADD_0 is shifted from the "H" state to the "L" state. As a result, when the mode discrimination signal tmz_1 is on the "L" state, the pulse width of the output signal out is controlled based on the timing at which the pulse width control signal ADD_0 is shifted from the "H" state to the "L" state. As shown in FIG. 4, during the period in which the mode discrimination signal tmz_1 is on the "H" state, the pulse width of the output signal out is extended by a predetermined constant time A as compared to the pulse width of the input signal in. On the contrary, during the period in which the mode discrimination signal tmz_1 is eon the "L" state, the pulse width of the output signal out can be adjusted by varying the timing at which the pulse width control signal ADD_0 is shifted from the "H" state to the "L" state.

As described above, it is capable of adjusting the pulse width of the output signal in the test mode of the semiconductor memory device. Therefore, it is not necessary to implement a delaying part for testing the semiconductor memory device so that time and expenses for tuning the delaying part in the test mode can be reduced.

The present application contains subject matter related to Korean patent application No. 2003-75986, filed in the Korean Patent Office on Oct. 29, 2003, the entire contents of which being incorporated herein by reference.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pulse width adjusting circuit for use in a semiconductor memory device, comprising:
   pulse width adjusting means for variably adjusting a pulse width of an output signal in synchronization with a pulse width control signal and a mode discrimination signal that is provided externally in a test mode of the semiconductor memory device, wherein the mode discrimination signal discriminates between the test mode and a normal mode,
   wherein the pulse width adjusting means includes:
   a first transfer gate using the mode discrimination signal as a gate control signal and receiving a first signal that is based on the pulse width control signal as an input; and
   a second transfer gate using the mode discrimination signal as a gate control signal and receiving a second signal that is generated by extending the pulse width by delaying the input signal for a predetermined time as an input.

2. The pulse width adjusting circuit for use in the semiconductor memory device of claim 1, wherein the pulse width adjusting means extends the pulse width of an input signal by delaying the input signal for a predetermined time to output as the output signal in a normal mode of the semiconductor memory device.

3. The pulse width adjusting circuit for use in the semiconductor memory device of claim 1, further including a delaying means for extending the pulse width of the second signal.

4. A pulse width adjusting method for use in a semiconductor memory device, the method comprising the steps of:
   (a) receiving a first signal that is based on an external pulse width control signal, and a second signal that is generated by extending a pulse width of an output signal of a pulse width adjusting circuit by a predetermined time;
   (b) selecting one of the first signal and the second signal according to a mode discrimination signal that is provided externally; and
   (c) variably adjusting the pulse width of the output signal in synchronization with the first signal and the mode discrimination signal in a test mode of the semiconductor device.

5. The pulse width adjusting method for use in the semiconductor memory device of claim 4, wherein the mode discrimination signal is used as a control signal of a plurality of transfer gates that receive the first signal and the second signal as inputs, respectively.

6. A semiconductor memory device for adjusting a pulse width of an output signal, comprising: pulse width adjusting means for variably adjusting a pulse width of the output signal in synchronization with a pulse width control signal and a mode discrimination signal that is provided externally in a test mode of the semiconductor memory device, wherein the mode discrimination signal discriminates between the test mode and a normal mode;
   wherein the pulse width adjusting means includes: a first transfer gate using the mode discrimination signal as a gate control signal and receiving a first signal that is based on the pulse width control signal as an input; and a second transfer gate using the mode discrimination signal as a gate control signal and receiving a second signal that is generated by extending the pulse width by delaying the input signal for a predetermined time as an input.

7. The semiconductor memory device as recited in claim 6, wherein the pulse width adjusting means extends the pulse width of an input signal by delaying the input signal for a predetermined time to output as the output signal in a normal mode of the semiconductor memory device.

8. The semiconductor memory device as recited in claim 6, further including a delaying means for extending the pulse width of the second signal.

* * * * *